United States Patent [19]
Ko

[11] Patent Number: 5,731,949
[45] Date of Patent: Mar. 24, 1998

[54] STRUCTURE OF CAPACITOR AND METHOD OF FRABRICATING SAME

[75] Inventor: Sang Gi Ko, Chungcheongbuk-do, Rep. of Korea

[73] Assignee: LG Semicon Co., Ltd., Chungcheongbuk-do, Rep. of Korea

[21] Appl. No.: 742,905

[22] Filed: Nov. 1, 1996

[30] Foreign Application Priority Data

Jun. 10, 1996 [KR] Rep. of Korea ............... 20639/1996

[51] Int. Cl.$^6$ .................. H01G 4/06; H01G 7/00
[52] U.S. Cl. .............. 361/313; 361/321.4; 361/321.5; 257/301; 437/60; 437/919; 29/25.42
[58] Field of Search ............... 257/301, 303, 257/304, 305; 361/311–313, 321.1, 321.2, 321.3, 321.4, 321.5, 322; 437/60, 919; 29/25.42

[56] References Cited

U.S. PATENT DOCUMENTS

| | | | |
|---|---|---|---|
| 5,442,584 | 8/1995 | Jeong et al. | 365/149 |
| 5,461,248 | 10/1995 | Jun | 257/301 |

OTHER PUBLICATIONS

"A New Cylindrical Capacitor Using Hemispherical Grained Si (HSG-Si) for 256Mb DRAMS", Watanabe, H. et al., IEDM 92, pp. 259–262, 1992.

Primary Examiner—Bot L. Ledynh
Attorney, Agent, or Firm—Morgan, Lewis & Bockius LLP

[57] ABSTRACT

A capacitor includes a substrate having a first trench, and a second trench, a first storage node having a first body and a first flange, the first body being on the first trench and having a first height and the first flange being extended at a top portion of the first body to a first length from the first body, a second storage node having a second body and a second flange, the second body being in the second trench and having a second height different from the first height of the first body, and the second flange being extended in a direction opposite to the first flange to a second length from the second length from the second body, a dielectric film on the surfaces of the first and second storage nodes, and a plate electrode on the dielectric film.

19 Claims, 14 Drawing Sheets

STRUCTURE OF CAPACITOR AND METHOD OF FRABRICATING SAME

BACKGROUND OF THE INVENTION

1. Field of the Invention

The present invention relates to a capacitor, and more particularly, to a structure of a capacitor and a method of fabricating the same.

2. Discussion of the Related Art

A conventional structure of a capacitor and a conventional method of fabricating the same will be described with reference to the appended drawings.

FIG. 1 is a layout of a conventional capacitor. As shown in FIG. 1, the conventional structure of a capacitor includes a wordline 1, an active region 2 perpendicular to the wordline 1, a plurality of node contacts 3 formed on the active region 2 between respective wordlines 1, and a plurality of capacitors 4 connected to a respective node contact 3 and formed in the same direction as the active region 2.

FIG. 2 is a sectional view taken along I–I' line of FIG. 1. As shown in FIG. 2, the capacitor includes a first insulating film 6, a second insulating film 7, storage nodes 8, a dielectric film 9, and a plate electrode 10. A first insulating film 6 is formed with contact holes on a semiconductor substrate 5 having the active region 2 at a certain interval. On the first insulating film 6, a second insulating film 7 is formed. The storage nodes 8 are formed extended to a certain height on the second insulating film 7 along a base of the contact holes. A dielectric film 9 is formed on the entire surface of the storage nodes 8. A plate electrode 10 is formed on the dielectric film 9.

FIGS. 3a to 3e are sectional views showing fabricating processes of a conventional capacitor taken along I–I' line of FIG. 1.

As shown in FIG. 3a, the first insulating film 6, the second insulating film 7, and a first sensitivity film 11 are sequentially formed on the substrate 5 having the active region 2. Then, the first sensitivity film 11 is patterned. Subsequently, node contact holes 12 are formed at a certain interval by selectively removing the second insulating film 7 and the first insulating film 6 using the patterned sensitivity film 11 as a mask.

As shown in FIG. 3b, the first sensitivity film 11 is removed and then a first polysilicon 13, a third insulating film 14, and a second sensitivity film 15 are sequentially formed on the entire surface of the node contact holes 12. Then, the second sensitivity film 15 is patterned. The third insulating film 14 and the first polysilicon 13 are selectively removed using the patterned second sensitivity film 15 as a mask to expose portions of the second insulating film 7.

As shown in FIG. 3c, the second sensitivity film 15 is removed to form a second polysilicon 16 on the entire surface of the exposed second insulating film 7 including the third insulating film 14. Thereafter, the second polysilicon 16 is etched by an etch back process to form a sidewall spacer of the second polysilicon 16 at both sides of the third insulating film 14.

As shown in FIG. 3d, the third insulating film 14 is removed by an etching process to form the storage nodes.

As shown in FIG. 3e, the dielectric film 9 is formed on the entire surface of the storage nodes and the plate electrode 10 is finally formed on the dielectric film 9 to complete a capacitor.

However, the conventional structure of a capacitor and the conventional method of fabricating the same as aforementioned have a disadvantage in that the area of the capacitor is too small to fabricate a capacitor having a large capacitance. For this reason, the conventional capacitor is not suitable for a device that requires having a large capacitance.

SUMMARY OF THE INVENTION

Accordingly, the present invention is directed to a structure of a capacitor and a method of fabricating the same that substantially obviates one or more of the problems due to limitations and disadvantages of the related art.

A feature of the present invention is to provide a device having an enlarged area of the capacitor.

To achieve this and other advantages and in accordance with the purpose of the present invention, as embodied and broadly described, a capacitor according to the present invention includes a substrate having a first trench and a second trench, a first storage node having a first body and a first flange, a second storage node having a second body and a second flange, a dielectric film formed on the entire surface of the first and second storage nodes, and a plate electrode formed on the dielectric film. The first body is formed extended to a certain height on the substrate along a base of the first trench and the first flange is formed extended to a certain length from the first body. The second body is formed extended higher than the first body along a base of the second trench and the second flange is formed extended to a certain length from the second body. The first and second flanges are formed with octagonal shapes. The second flange is disposed on an upper portion of the first flange and is overlapped with some of the first flange.

In another aspect of the present invention, a capacitor comprises a substrate having a first trench and a second trench; a first storage node having a first body and a first flange, the first body being in the first trench and having a first height, and the first flange being extended from the first body to a first length; a second storage node having a second body and a second flange, the second body being in the second trench and having a second height different from the first height of the first body, and the second flange being extended in a direction opposite to the first flange and having a second length from the second body; a dielectric film on surfaces of the first and second storage nodes; and a plate electrode on the dielectric film.

In another aspect of the present invention, a capacitor comprises a substrate; a first insulating film on the substrate having a first contact hole and a second contact hole; a second insulating film on the first insulating film; a first storage node having a first body and a first flange, the first body being extended to a first height over the first insulating film and the first flange being extended to a first length from the first body; a second storage node having a second body, a second flange, and a bent portion, the bent portion connecting the second body and the second flange, the second body being extended higher than the first body, and the second flange being extended to a second length from the second body; a dielectric film on surfaces of the first and second storage nodes; and a plate electrode on the dielectric film.

In another aspect of the present invention, a capacitor comprises a substrate; a first insulating film on the substrate having a first contact hole and a second contact hole; a first storage node having a first body, a first flange, and a bent portion, the bent portion connecting the first body and the first flange, the first body being extended to a first height and the first flange being extended from the first body to a first length; a second storage node having a second body and a second flange, the second body having substantially same height as the first body of the first storage node, the second flange being extended to a second length in a direction opposite to the first flange from a position below the top of the second body; a dielectric film on surfaces of the first and second storage nodes; and a plate electrode on the dielectric film.

In another aspect of the present invention, a method of fabricating a capacitor comprises the steps of forming a first insulating film, a second insulating film, a third insulating film, and a first polysilicon on a substrate, respectively; patterning the first polysilicon to define a first storage node region; forming a fourth insulating film on the patterned first polysilicon and the third insulating film; defining a first node contact region over the patterned first polysilicon and a second node contact region over the third insulating film by coating and patterning a first sensitivity film on the fourth insulating film; forming a first node contact by sequentially removing the fourth insulating film, the first polysilicon, the third insulating film, the second insulating film, and the first insulating film using the first sensitivity film as a mask; forming a second node contact by removing the fourth insulating film, the third insulating film, the second insulating film, and the first insulating film; removing the first sensitivity film; forming a second polysilicon on the first and second node contacts and the fourth insulating film; filling an insulating material in the first and second node contacts; defining a second storage node region by coating the insulating material and the second polysilicon with a second sensitivity film and patterning the second sensitivity film; exposing a portion of the first polysilicon by removing a portion of the second polysilicon, the fourth insulating film, and the insulating material using the patterned second sensitivity film as a mask; removing the second sensitivity film; forming first and second storage nodes by removing the remaining insulating material, the fourth insulating film, and the third insulating film; forming a dielectric film on the first and second storage nodes; and forming a plate electrode on the dielectric film.

In a further aspect of the present invention, a method of fabricating a capacitor comprises the steps of forming a first insulating film, a second insulating film, and a third insulating film on a substrate, respectively; patterning the third insulating film to define a first storage node; forming a fourth insulating film on the patterned third insulating film and the second insulating film; defining a first node contact region and a second node contact region on the second insulating film by coating and patterning a first sensitivity film on the fourth insulating film; forming a first node contact by sequentially removing the fourth insulating film, the third insulating film, the second insulating film and the first insulating film using the first sensitivity film as a mask; forming a second node contact by sequentially removing the fourth insulating film, the second insulating film, and the first insulating film; removing the first sensitivity film; forming a polysilicon on the first and second node contacts and the fourth insulating film; filling an insulating material in the first and second node contacts; defining a second storage node region by coating the insulating material and the polysilicon with a second sensitivity film and patterning the second sensitivity film; exposing a portion of the fourth insulating film by removing a portion of the polysilicon and the insulating material using the patterned second sensitivity film as a mask; removing the second sensitivity film; removing remaining insulating material, the fourth insulating film, and the third insulating film; forming a dielectric film on the first and second storage nodes; and forming a plate electrode on the dielectric film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
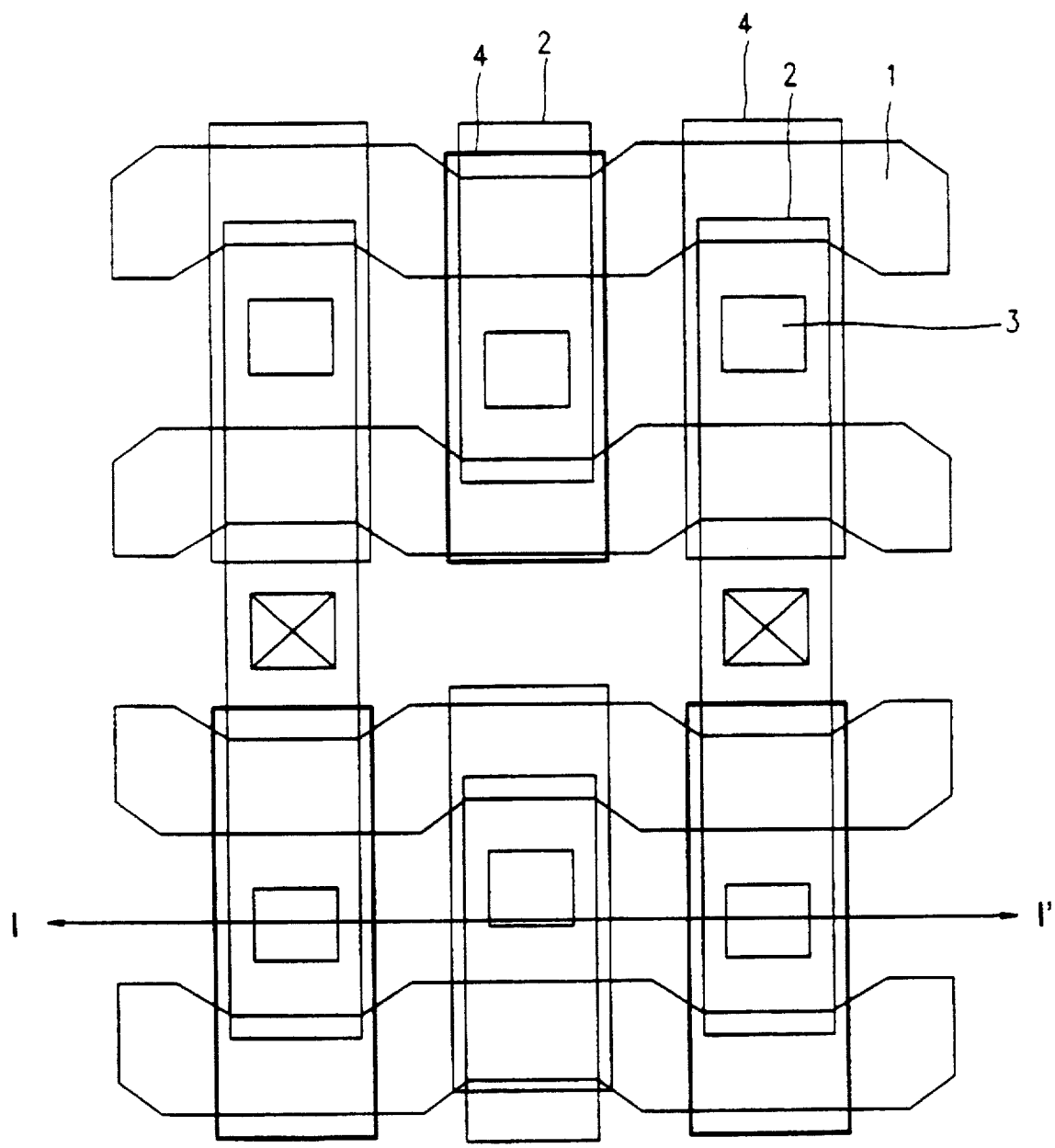
FIG. 1 is a layout of a conventional capacitor.
Figure 2:
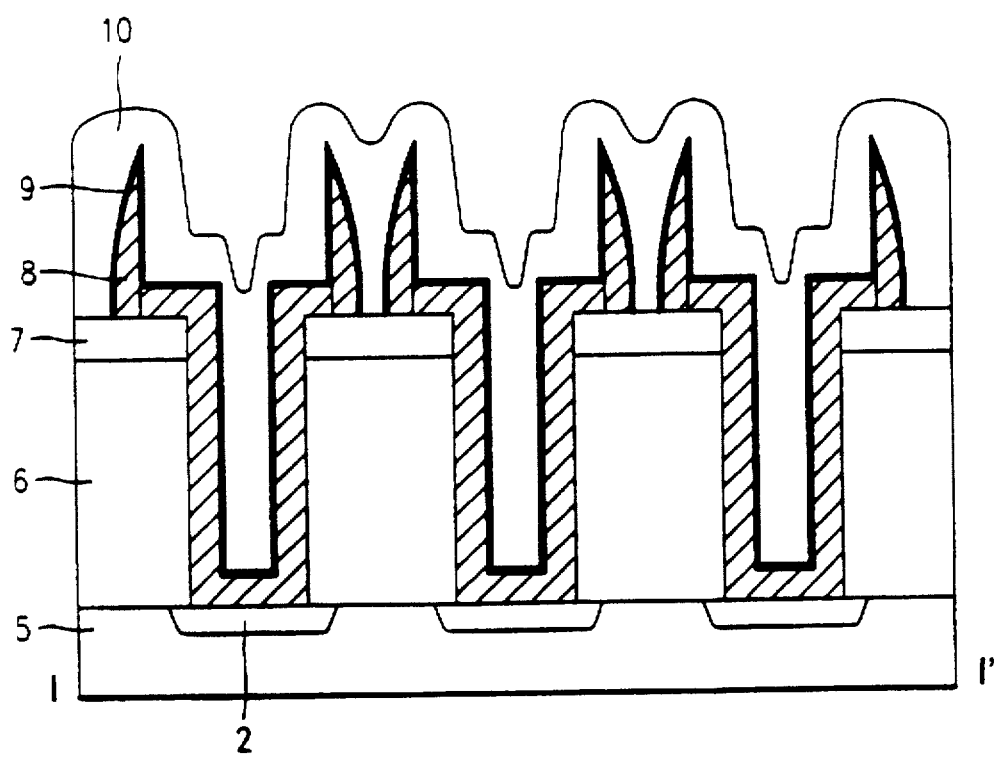
FIG. 2 is a sectional view taken along line I–I' of FIG. 1.
Figure 3A:
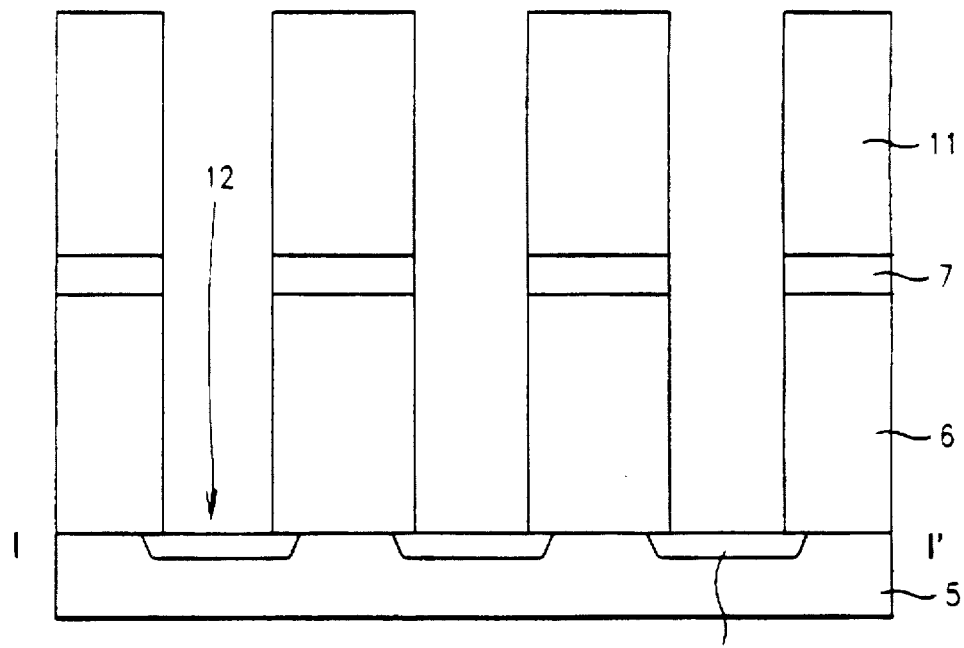
FIGS. 3a to 3e are sectional views showing the fabricating process of a capacitor taken along line I–I' of FIG. 1.
Figure 3B:
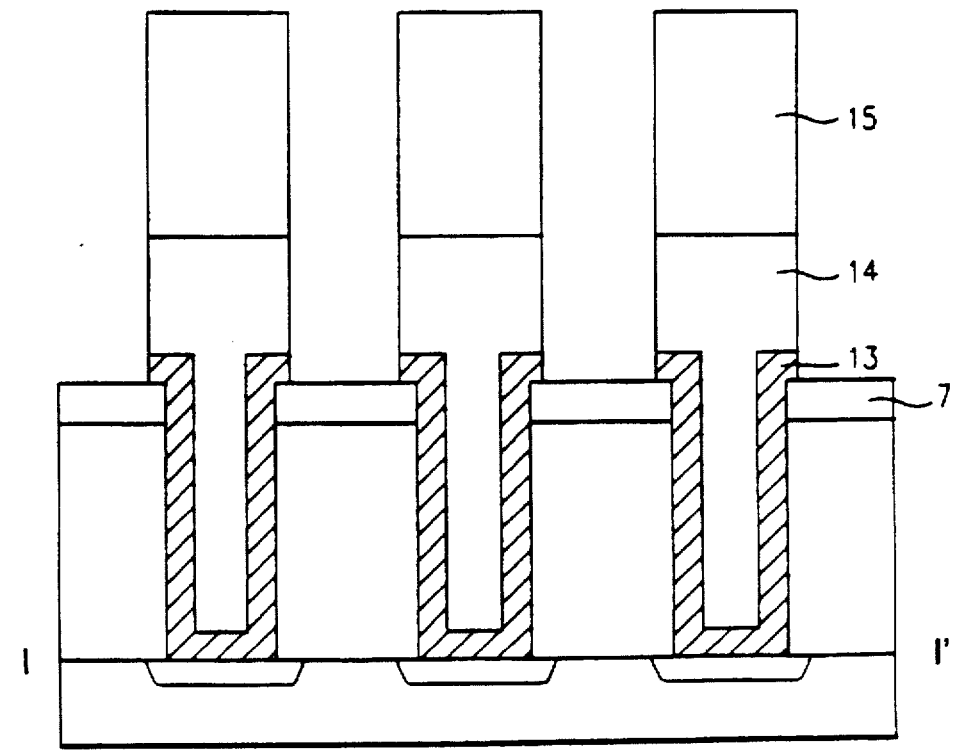
Figure 3C:
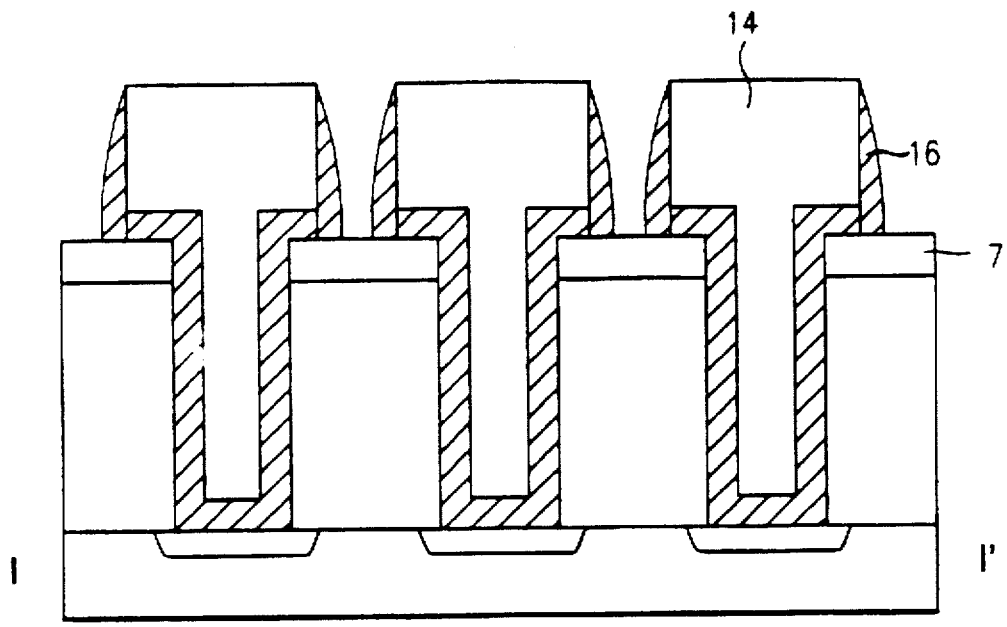
Figure 3D:
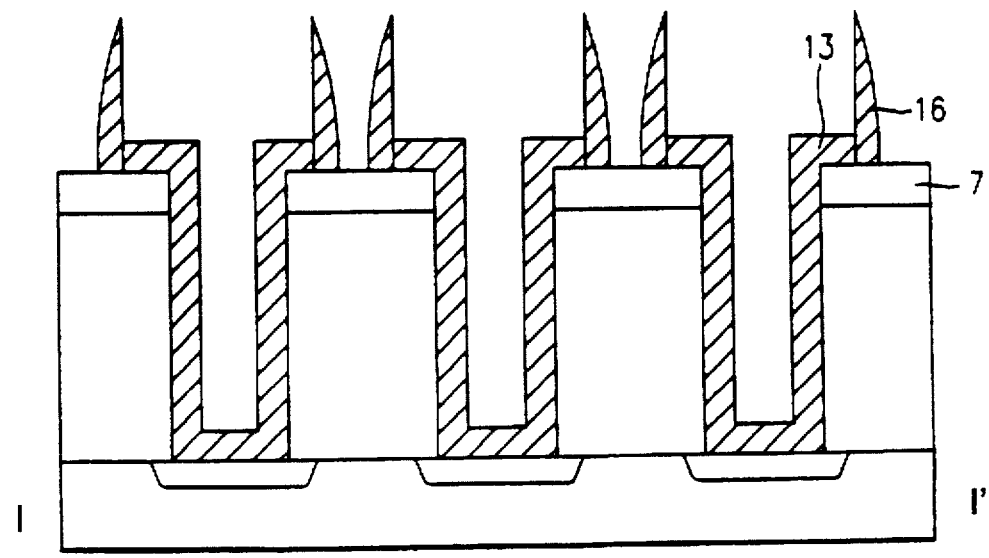
Figure 3E:
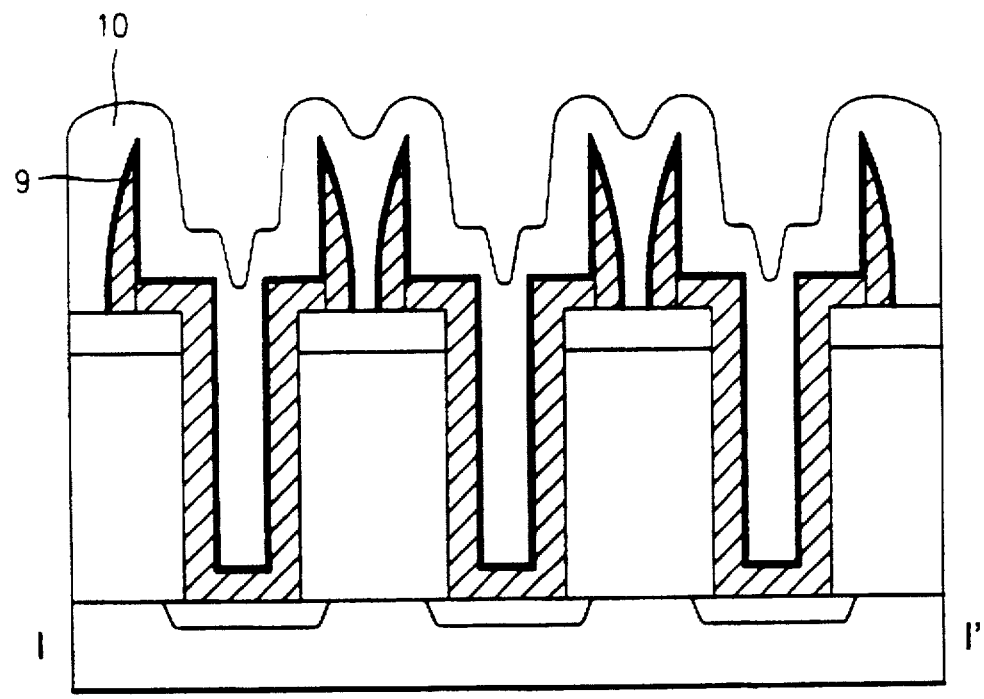
Figure 4:
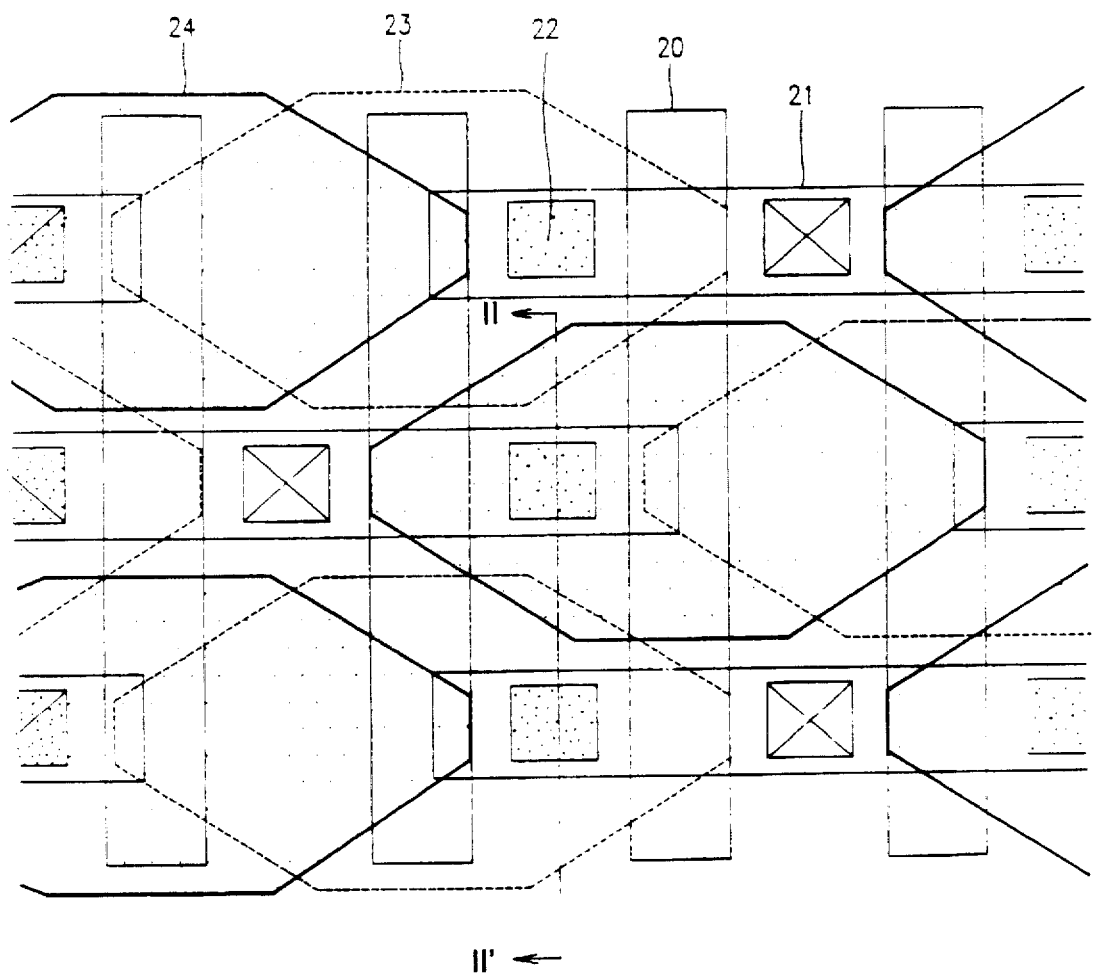
FIG. 4 is a layout of a capacitor according to the first and second embodiments of the present invention.

FIG. 4 is a layout of a capacitor according to the first and second embodiments of the present invention.

As shown in FIG. 4, the structure of a capacitor according to the present invention comprises a wordline 20, an active region 21 perpendicular to the wordline 20, a plurality of node contacts 22 formed on the active region 21 between respective wordlines 20, and a plurality of first and second capacitors 23 and 24 connected to the respective node contacts 22. A dotted line region includes the first capacitor 23 and a solid line region includes the second capacitor 24. The first and second capacitors 23 and 24 have a floating structure that overlap each other.

Figure 5:
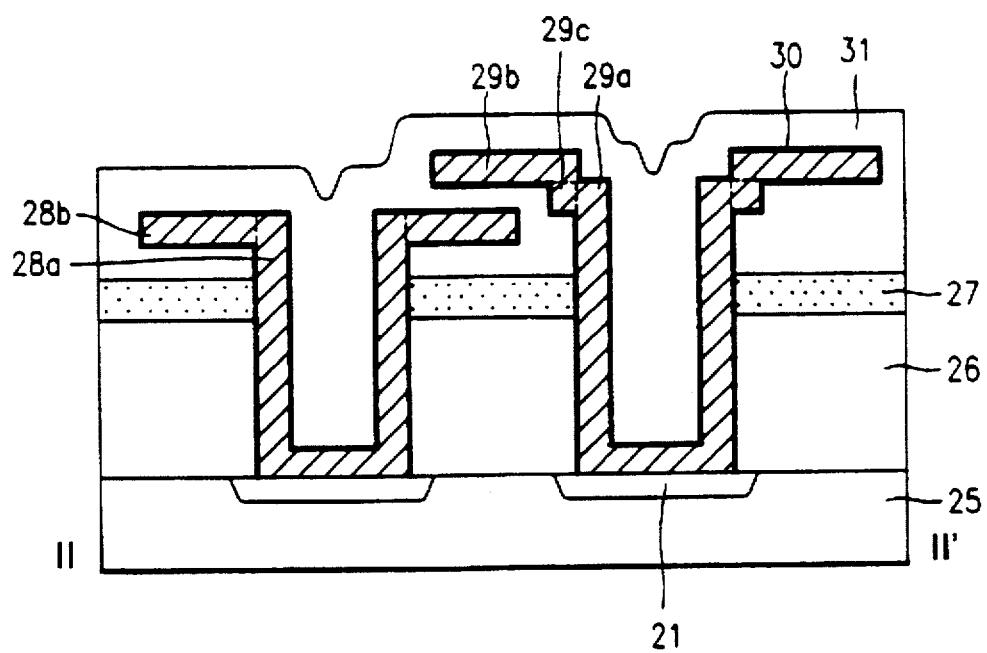
FIG. 5 is a sectional view taken along line II–II' of FIG. 4 according to the first embodiment of the present invention.

FIG. 5 is a sectional view taken along line II–II' of FIG. 4 according to the first embodiment of the present invention.

As shown in FIG. 5, a first insulating film 26 having first and second contact holes is formed on a semiconductor substrate 25 having the active region 21. A second insulating film 27 is formed on the first insulating film 26. A first storage node includes a first body 28a and a first flange 28b. The first body 28a is formed extended to a certain height on the first insulating film 26 along a base of the first contact hole. The first flange 28b is formed extended to a certain length from the first body 28a.

A second storage node includes a second body 29a, a second flange 29b and a bent region 29c. The second body 29a is formed to extend higher than the first body 28a along a base of the second contact hole. The second flange 29b is formed to extend to a certain length from the second body 29a. The bent region 29c is formed between the second body 29a and the second flange 29b. A dielectric film 30 is formed on the entire surface of the first and second storage nodes. A plate electrode 31 is finally formed on the dielectric film 30.

The first and second flanges 28b and 29b are formed having octagonal shapes. The second flange 29b is disposed above an upper portion of the first flange 28b and overlaps some of the first flange 28b.

FIGS. 6a to 6g are sectional views showing the fabricating process of a capacitor taken along line II-II' of FIG. 4 according to the first embodiment of the present invention.

Figure 6A:
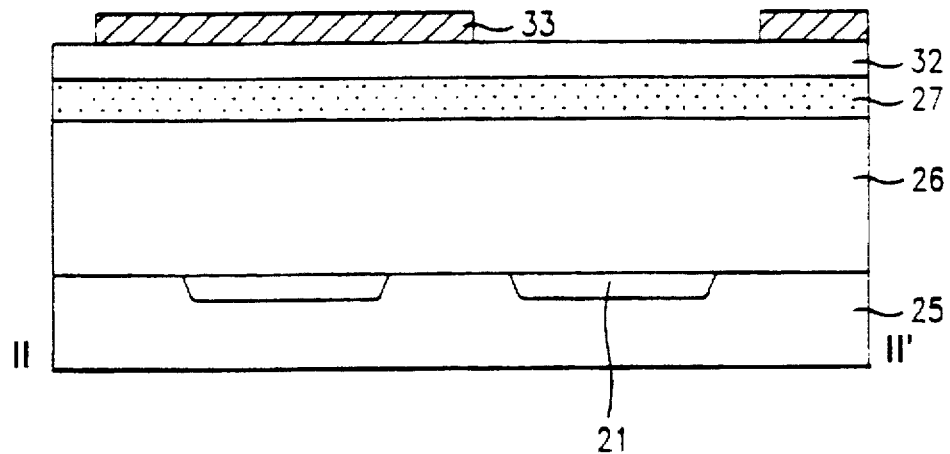
FIGS. 6a to 6g are sectional views showing the fabricating process of a capacitor taken along line II–II' of FIG. 4 according to the first embodiment of the present invention.

As shown in FIG. 6a, the first insulating film 26, the second insulating film 27, a third insulating film 32, and a first polysilicon 33 are sequentially formed on the semiconductor substrate 25 having the active region 21. Then, the first polysilicon 33 is patterned to define the first storage node region. The first insulating film 26 includes an interlayer dielectric(ILD) film, the second insulating film 27 includes a nitride film, and the third insulating film 32 includes an oxide film.

Figure 6B:
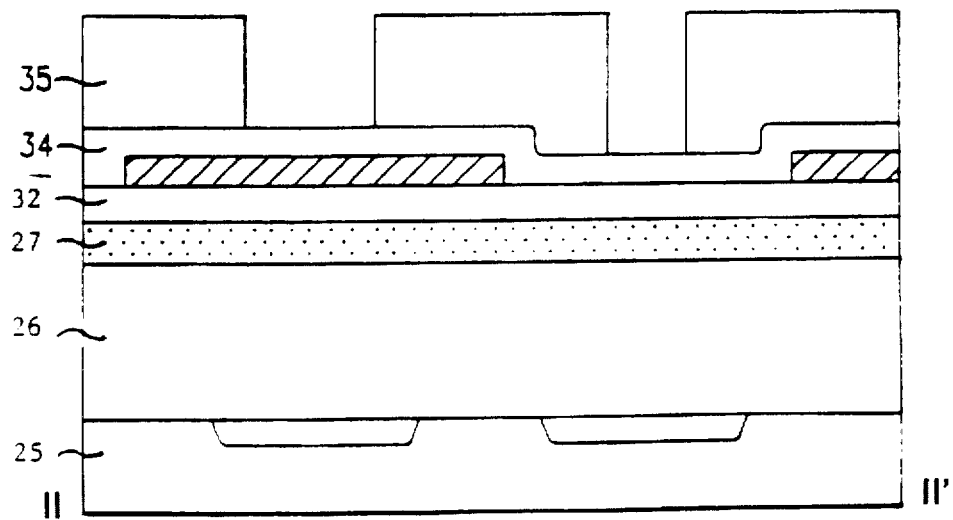

As shown in FIG. 6b, a fourth insulating film 34 is formed on the entire surface of the patterned first polysilicon 33 and the third insulating film 32. Then, the fourth insulating film 34 is coated with a first sensitivity film 35. At this time, the fourth insulating film 34 includes an oxide film. Subsequently, the first node contact region is defined over the first polysilicon 33 and the second node contact region is defined over the third insulating film 32 by patterning the first sensitivity film 35.

Figure 6C:
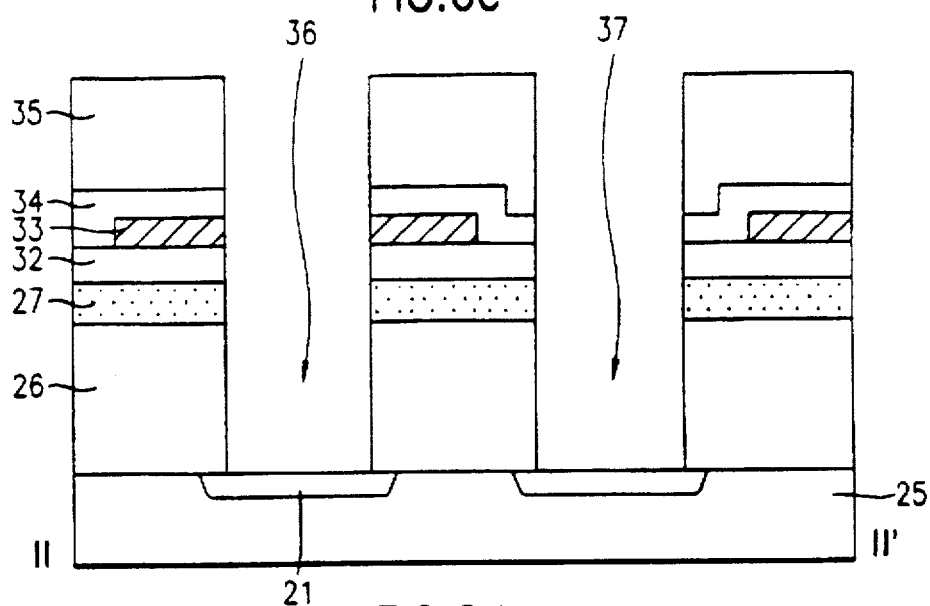

As shown in FIG. 6c, the fourth insulating film 34, the first polysilicon 33, the third insulating film 32, the second insulating film 27, and the first insulating film 26 are sequentially removed using the first sensitivity film 35 as a mask to expose the active region 21 of the substrate 25. As a result, a first node contact 36 is formed. Similarly, a second node contact 37 is formed by sequentially removing the fourth insulating film 34, the third insulating film 32, the second insulating film 27, and the first insulating film 26.

Figure 6D:
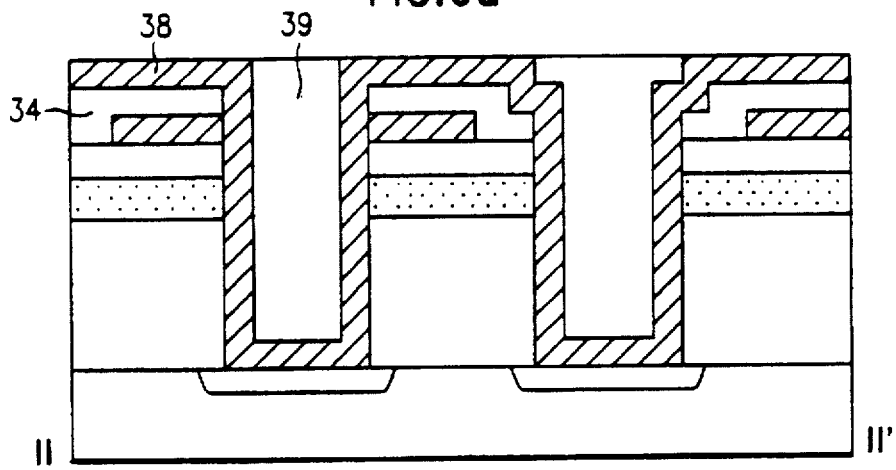

As shown in FIG. 6d, the first sensitivity film 35 is removed and a second polysilicon 38 is formed on the entire surface of the first and second node contacts 36 and 37 and the fourth insulating film 34. An insulating material 39 is filled in the first and second node contacts 36 and 37 by an SOG process, for example. In this case, the insulating material 39 includes SOG material.

Figure 6E:
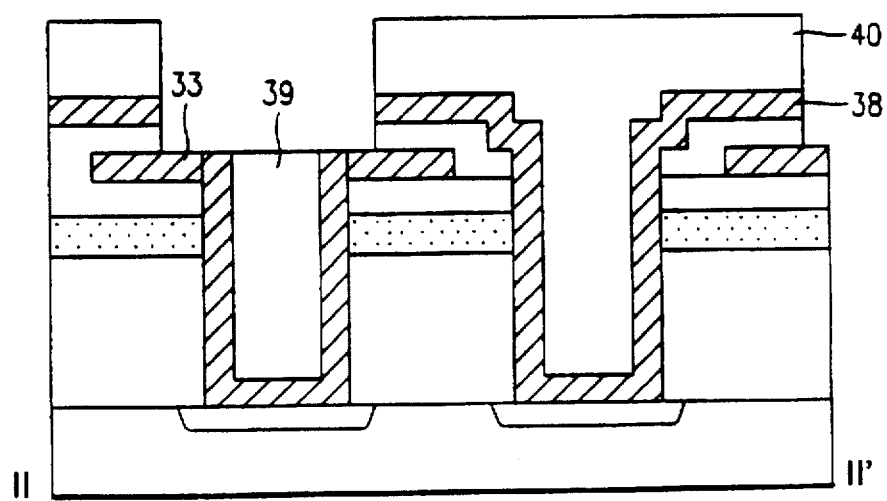

As shown in FIG. 6e, the second polysilicon 38 and the insulating material 39 are coated with a second sensitivity film 40. The second sensitivity film 40 is patterned to define a second storage node region. Then, the second polysilicon 38, the fourth insulating film 34, and some of the insulating material 39 are removed using the patterned second sensitivity film 40 as a mask to expose some of the first polysilicon 33.

Figure 6F:
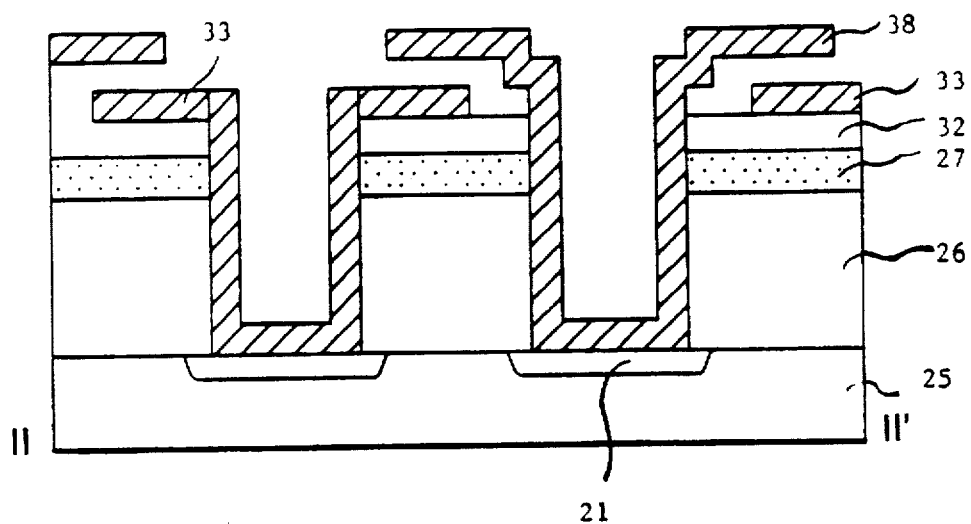

As shown in FIG. 6f, the second sensitivity film 40, the remaining insulating material 39, the fourth insulating film 34, and the third insulating film 32 are removed to form the first and second storage nodes.

Figure 6G:
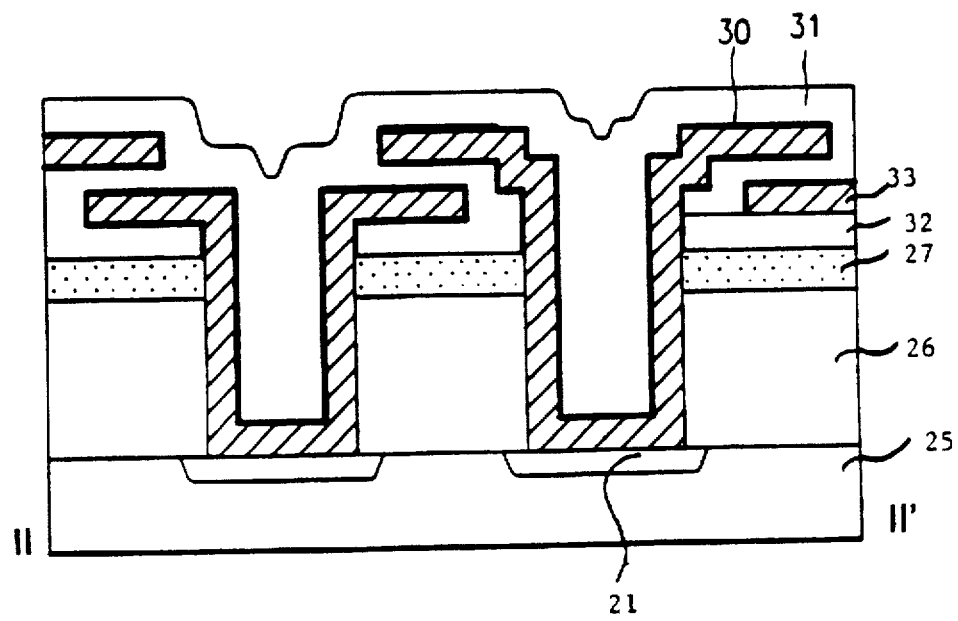

As shown in FIG. 6g, the dielectric film 30 is formed on the entire surface of the first and second storage nodes, and the plate electrode 31 is formed on the dielectric film 30. As a result, first and second capacitors are formed in accordance with the present invention.

Figure 7:
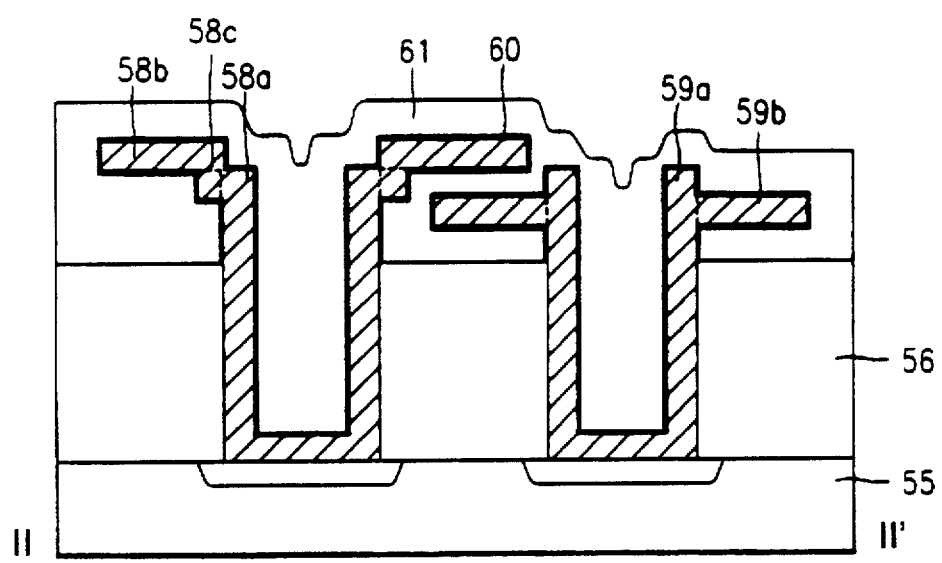
FIG. 7 is a sectional view taken along line II–II' of FIG. 4 according to the second embodiment of the present invention.

FIG. 7 is a sectional view taken along line II-II' of FIG. 4 according to the second embodiment of the present invention.

As shown in FIG. 7, a first insulating film 56 having first and second contact holes is formed on a semiconductor substrate 55 having an active region 51. A first storage node 58 includes a first body 58a, a first flange 58b, and a bent region 58c. The first body 58a is formed extended to a certain height on the first insulating film 56 along a base of the first contact hole. The first flange 58b is formed extended to a certain length from the first body 58a. The bent region 58c is disposed between the first body 58a and the first flange 58b.

A second storage node 59 includes a second body 59a and a second flange 59b. The second body 59a is formed extended to the same height as the base of the first flange 58b along a base of the second contact hole. The second flange 59b is formed extended to a certain length from a predetermined position below an upper portion of the second body 59a. A dielectric film 60 is formed on the entire surface of the first and second storage nodes 58 and 59. A plate electrode 61 is formed on the dielectric film 60.

The first and second flanges 58b and 59b are formed with octagonal shapes. The first flange 58b is disposed above an upper portion of the second flange 59b and overlaps some of the second flange 59b. In addition, the second body 59a has the same height as the first body 58a of the first storage node 58, and the second flange 59b has the same height as the lower portion of the bent region 58c of the first storage node 58.

FIGS. 8a to 8g are sectional views showing the fabricating process of a capacitor taken along line II-II' of FIG. 4 according to the second embodiment of the present invention.

Figure 8A:
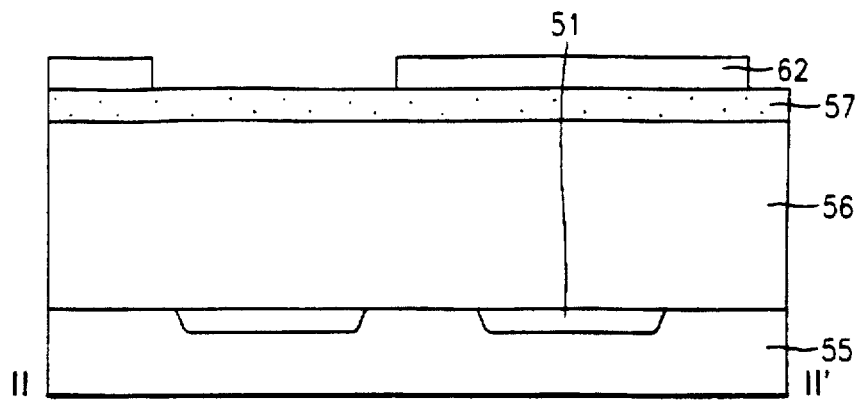
FIGS. 8a to 8g are sectional views showing the fabricating process of a capacitor taken along line II–II' of FIG. 4 according to the second embodiment of the present invention.

As shown in FIG. 8a, the first insulating film 56, a second insulating film 57, and a third insulating film 62 are sequentially formed on the semiconductor substrate 55 having the active region 51. Then, the third insulating film 62 is patterned to define the second storage node region. The first insulating film 56 includes an interlayer dielectric(ILD) film, the second insulating film 57 includes a nitride film, and the third insulating film 62 includes an oxide film.

Figure 8B:
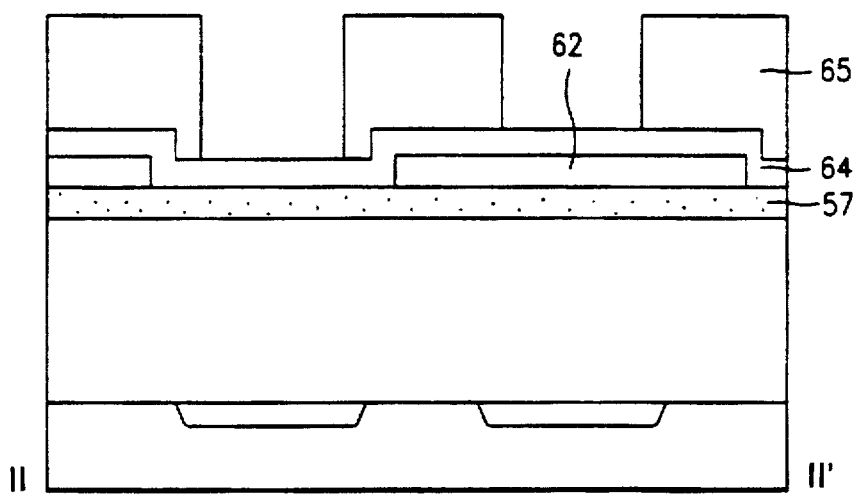

As shown in FIG. 8b, a fourth insulating film 64 is formed on the entire surface of the patterned third insulating film 62 and the second insulating film 57. Then, the fourth insulating film 64 is coated with a first sensitivity film 65. At this time, the fourth insulating film 64 includes a nitride film. Subsequently, the second node contact region is defined over the third insulating film 62 and the first node contact region is defined over the second insulating film 57 by patterning the first sensitivity film 65.

Figure 8C:
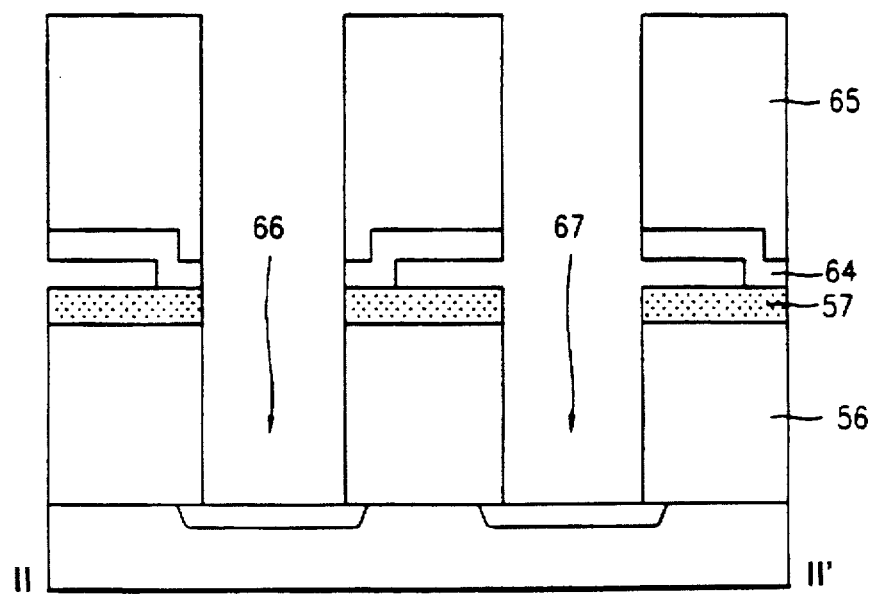

As shown in FIG. 8c, the fourth insulating film 64, the third insulating film 62, the second insulating film 57, and the first insulating film 56 are sequentially removed using the first sensitivity film 65 as a mask to form a second node contact 67. Similarly, a first node contact 66 is formed by sequentially removing the fourth insulating film 64, the second insulating film 57, and the first insulating film 56.

Figure 8D:
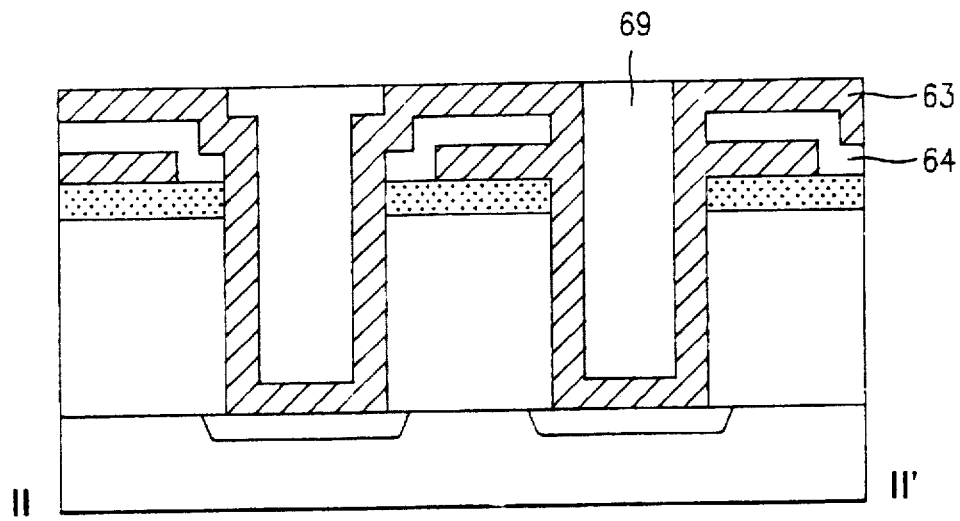

As shown in FIG. 8d, the first sensitivity film 65 is removed and polysilicon 63 is formed on the entire surface of the first and second node contacts 66 and 67 and the fourth insulating film 64. An insulating material 69 is filled in the first and second node contacts 66 and 67 by an SOG process, for example. In this case, the insulating material 69 includes SOG material.

Figure 8E:
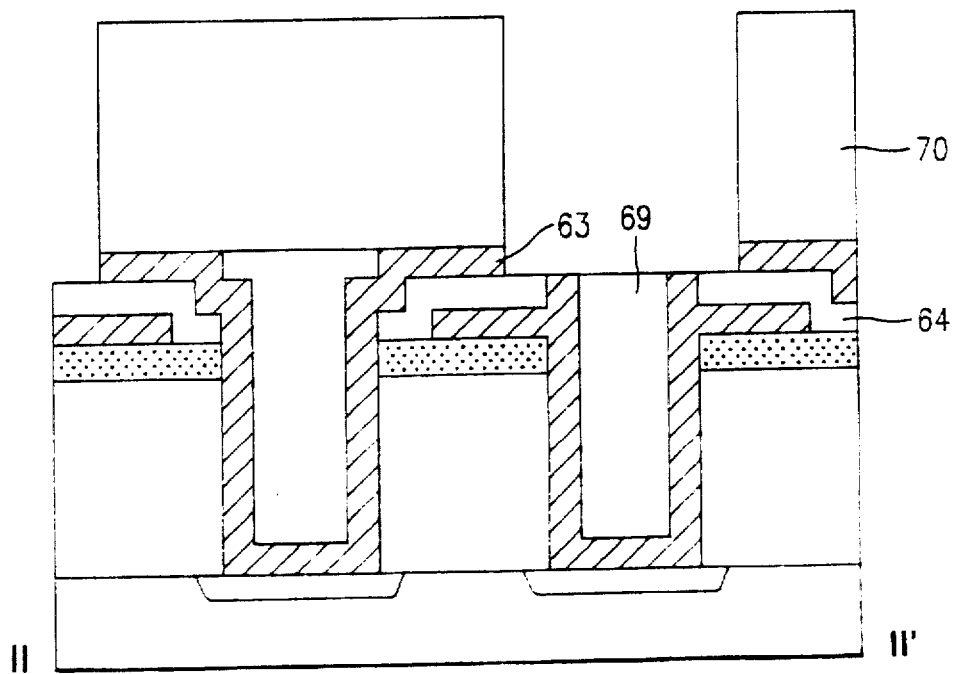

As shown in FIG. 8e, the insulating material 69 and the polysilicon 63 are coated with a second sensitivity film 70. The second sensitivity film 70 is patterned to define a first storage node region. Then, the polysilicon 63 and some of the insulating material 69 are removed using the patterned second sensitivity film 70 as a mask to expose some of the fourth insulating film 64.

Figure 8F:
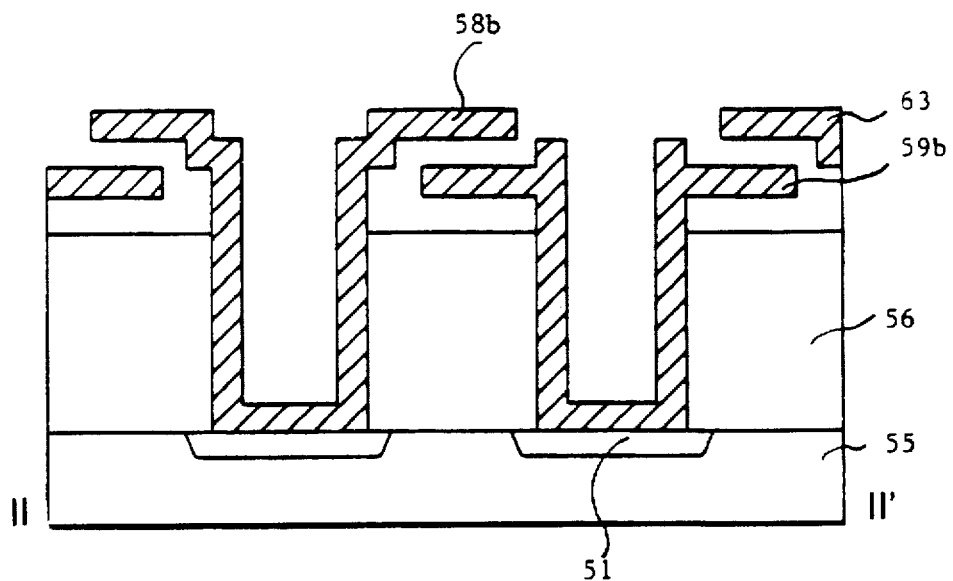

As shown in FIG. 8f, the second sensitivity film 70, the remaining insulating material 69, the fourth insulating film 64, and the second insulating film 57 are removed to form the first and second storage nodes.

Figure 8G:
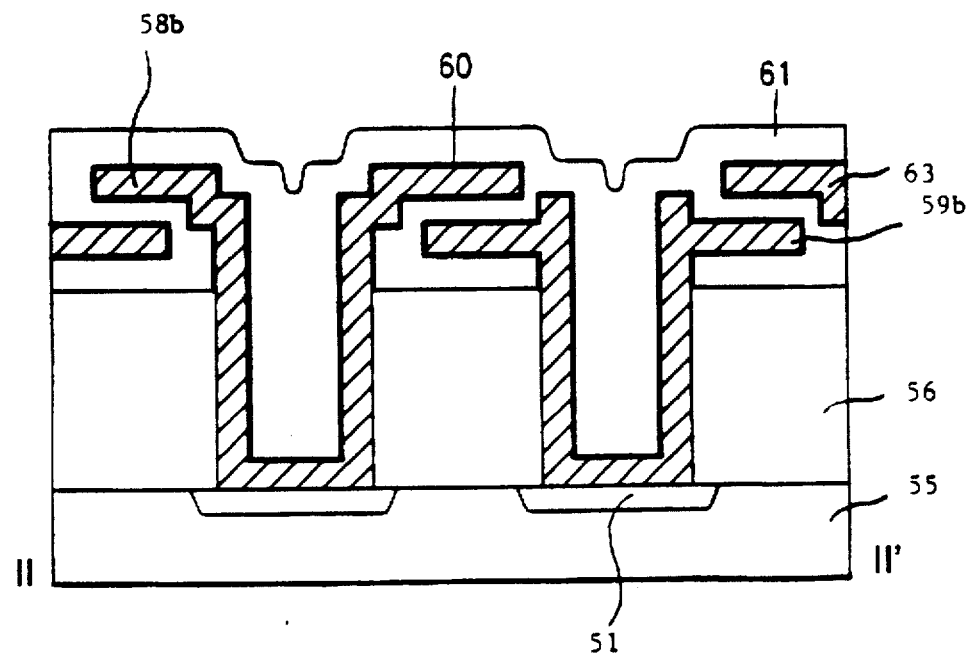

As shown in FIG. 8g, the dielectric film 60 is formed on the entire surface of the first and second storage nodes, and the plate electrode 61 is formed on the dielectric film 60. As a result, the first and second capacitors are formed.

As aforementioned, the structure of a capacitor and the method of fabricating the same according to the present invention has the following advantages. Since the first and second storage nodes are formed to be overlapped with each other, the area of the capacitor is large enough to accommodate a device having a large capacitance.

It will be apparent to those skilled in the art that various modifications and variations can be made in the structure of a capacitor and a method of fabricating the same of the present invention without departing from the spirit or scope of the invention. Thus, it is intended that the present invention cover the modifications and variations of this invention provided they come within the scope of the appended claims and their equivalents.

What is claimed is:

1. A capacitor comprising:
   a substrate having a first trench and a second trench;
   a first storage node having a first body and a first flange, the first body being in the first trench and having a first height, and the first flange being extended from the first body to a first length;
   a second storage node having a second body and a second flange, the second body being in the second trench and having a second height different from the first height of the first body, and the second flange being extended in a direction opposite to the first flange and having a second length from the second body;
   a dielectric film on surfaces of the first and second storage nodes; and
   a plate electrode on the dielectric film.

2. The capacitor according to claim 1, wherein the first and second flanges have octagonal shapes.

3. The capacitor according to claim 1, wherein the second flange is over the first flange and overlaps a portion of the first flange.

4. A capacitor comprising:
   a substrate;
   a first insulating film on the substrate having a first contact hole and a second contact hole;
   a second insulating film on the first insulating film;
   a first storage node having a first body and a first flange, the first body being extended to a first height over the first insulating film and the first flange being extended to a first length from the first body;
   a second storage node having a second body, a second flange, and a bent portion, the bent portion connecting the second body and the second flange, the second body being extended higher than the first body, and the second flange being extended to a second length from the second body;
   a dielectric film on surfaces of the first and second storage nodes; and
   a plate electrode on the dielectric film.

5. The capacitor according to claim 4, wherein the first and second flanges have octagonal shapes.

6. The capacitor according to claim 4, wherein the second flange is over the first flange and overlaps a portion of the first flange.

7. The capacitor according to claim 4, wherein the substrate includes a first active region and a second active region, the first body positioned over the first active region and the second body positioned over the second active region.

8. A capacitor comprising:
   a substrate;
   a first insulating film on the substrate having a first contact hole and a second contact hole;
   a first storage node having a first body, a first flange, and a bent portion, the bent portion connecting the first body and the first flange, the first body being extended to a first height and the first flange being extended from the first body to a first length;
   a second storage node having a second body and a second flange, the second body having substantially same height as the first body of the first storage node, the second flange being extended to a second length in a direction opposite to the first flange from a position below the top of the second body;
   a dielectric film on surfaces of the first and second storage nodes; and
   a plate electrode on the dielectric film.

9. The capacitor according to claim 8, wherein the first and second flanges have octagonal shapes.

10. The capacitor according to claim 8, wherein the first flange is over an upper portion of the second flange and overlaps a portion of the second flange.

11. The capacitor according to claim 8, wherein the substrate includes a first active region and a second active region, the first body positioned over the first active region and the second body positioned over the second active region.

12. A method of fabricating a capacitor comprising the steps of:
    forming a first insulating film, a second insulating film, a third insulating film, and a first polysilicon on a substrate, respectively;
    patterning the first polysilicon to define a first storage node region;
    forming a fourth insulating film on the patterned first polysilicon and the third insulating film;
    defining a first node contact region over the patterned first polysilicon and a second node contact region over the third insulating film by coating and patterning a first sensitivity film on the fourth insulating film;
    forming a first node contact by sequentially removing the fourth insulating film, the first polysilicon, the third insulating film, the second insulating film, and the first insulating film using the first sensitivity film as a mask;
    forming a second node contact by removing the fourth insulating film, the third insulating film, the second insulating film, and the first insulating film;
    removing the first sensitivity film;
    forming a second polysilicon on the first and second node contacts and the fourth insulating film;
    filling an insulating material in the first and second node contacts;
    defining a second storage node region by coating the insulating material and the second polysilicon with a second sensitivity film and patterning the second sensitivity film;

exposing a portion of the first polysilicon by removing a portion of the second polysilicon, the fourth insulating film, and the insulating material using the patterned second sensitivity film as a mask;

removing the second sensitivity film;

forming first and second storage nodes by removing the remaining insulating material, the fourth insulating film, and the third insulating film;

forming a dielectric film on the first and second storage nodes; and forming a plate electrode on the dielectric film.

13. The method of fabricating a capacitor according to claim 12, wherein the step of forming the first insulating film includes the step of forming an interlayer dielectric film, the step of forming the second insulating film includes the step of forming a nitride film, and the step of forming the fourth insulating film includes the step of forming an oxide film.

14. The method of fabricating a capacitor according to claim 12, wherein the first and second node contacts are filled with spin-on glass material.

15. A method of fabricating a capacitor comprising the steps of:

forming a first insulating film, a second insulating film, and a third insulating film on a substrate, respectively;

patterning the third insulating film to define a first storage node;

forming a fourth insulating film on the patterned third insulating film and the second insulating film;

defining a first node contact region and a second node contact region on the second insulating film by coating and patterning a first sensitivity film on the fourth insulating film;

forming a first node contact by sequentially removing the fourth insulating film, the third insulating film, the second insulating film and the first insulating film using the first sensitivity film as a mask;

forming a second node contact by sequentially removing the fourth insulating film, the second insulating film, and the first insulating film;

removing the first sensitivity film;

forming a polysilicon on the first and second node contacts and the fourth insulating film;

filling an insulating material in the first and second node contacts;

defining a second storage node region by coating the insulating material and the polysilicon with a second sensitivity film and patterning the second sensitivity film;

exposing a portion of the fourth insulating film by removing a portion of the polysilicon and the insulating material using the patterned second sensitivity film as a mask;

removing the second sensitivity film;

removing remaining insulating material, the fourth insulating film, and the third insulating film;

forming a dielectric film on the first and second storage nodes; and forming a plate electrode on the dielectric film.

16. The method of fabricating a capacitor according to claim 15, wherein the first insulating film includes an interlayer dielectric film, at least one of the second and fourth insulating films includes a nitride film, and the third insulating film includes an oxide film.

17. The method of fabricating a capacitor according to claim 15, wherein the first and second node contacts are filled with spin-on glass material.

18. A method of fabricating a capacitor comprising the steps of:

forming a first insulating film, a second insulating film, a third insulating film, and a first polysilicon on a substrate, respectively;

defining a first storage node region by patterning the first polysilicon;

forming a fourth insulating film on the patterned first polysilicon and the third insulating film;

defining a first node contact region over the patterned first polysilicon and a second node contact region over the third insulating film;

forming a first node contact by sequentially removing the fourth insulating film, the first polysilicon, the third insulating film, the second insulating film, and the first insulating film according to the defined first and second node contact regions;

forming a second node contact by removing the fourth insulating film, the third insulating film, the second insulating film, and the first insulating film;

forming a second polysilicon on the first and second node contacts and the fourth insulating film;

filling an insulating material in the first and second node contacts;

defining a second storage node region;

exposing a portion of the first polysilicon by removing a portion of the second polysilicon, the fourth insulating film, and the insulating material according to the defined second storage node region;

forming first and second storage nodes by removing the remaining insulating material, the fourth insulating film, and the third insulating film;

forming a dielectric film on the first and second storage nodes; and forming a plate electrode on the dielectric film.

19. A method of fabricating a capacitor comprising the steps of:

forming a first insulating film, a second insulating film, and a third insulating film on a substrate, respectively;

defining a first storage node region by patterning the third insulating film;

forming a fourth insulating film on the patterned third insulating film and the second insulating film;

defining a first node contact region and a second node contact region on the second insulating film;

forming a first node contact by sequentially removing the fourth insulating film, the third insulating film, the second insulating film and the first insulating film according to the defined first node contact region;

forming a second node contact by sequentially removing the fourth insulating film, the second insulating film, and the first insulating film according to the defined second node contact region;

forming a polysilicon on the first and second node contacts and the fourth insulating film;

filling an insulating material in the first and second node contacts;

defining a second storage node region;

exposing a portion of the fourth insulating film by removing a portion of the polysilicon and the insulating material according to the defined second storage node region;

removing remaining insulating material, the fourth insulating film, and the third insulating film;

forming a dielectric film on the first and second storage nodes; and forming a plate electrode on the dielectric film.

* * * * *

UNITED STATES PATENT AND TRADEMARK OFFICE
CERTIFICATE OF CORRECTION

PATENT NO. : 5,731,949
DATED : March 24, 1998
INVENTOR(S) : KO

It is certified that error appears in the above-identified patent and that said Letters Patent is hereby corrected as shown below:

On the Title page & Col. 1.;

In Item [54] Title: Line 2, change "FRABRICATING" to --

FABRICATING--.

In Item [57] ABSTRACT: Line 1, change "first trench, and" to --first trench and--.

Signed and Sealed this

Fifth Day of October, 1999

Attest:

Attesting Officer

Q. TODD DICKINSON

Acting Commissioner of Patents and Trademarks